US006954555B2

(12) United States Patent
Shimada

(10) Patent No.: US 6,954,555 B2
(45) Date of Patent: Oct. 11, 2005

(54) VARIABLE LENGTH CODING UNIT AND VARIABLE LENGTH DECODING UNIT

(75) Inventor: Toshiaki Shimada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 529 days.

(21) Appl. No.: 09/802,944

(22) Filed: Mar. 12, 2001

(65) Prior Publication Data

US 2001/0033697 A1 Oct. 25, 2001

(30) Foreign Application Priority Data

Apr. 20, 2000 (JP) ....................................... 2000-119999

(51) Int. Cl.[7] ............................ G06K 9/36; H03M 7/00

(52) U.S. Cl. .......................... 382/246; 382/233; 341/67

(58) Field of Search ................................ 382/233, 245, 382/246; 358/426.13; 341/59, 67

(56) References Cited

U.S. PATENT DOCUMENTS 5,933,536 A * 8/1999 Fukuzawa ................... 382/233
6,014,095 A * 1/2000 Yokoyama ................... 341/67

FOREIGN PATENT DOCUMENTS

JP A0575477 3/1993
JP A08256266 10/1996

* cited by examiner

*Primary Examiner*—Bhavesh M. Mehta
*Assistant Examiner*—Duy M. Dang
(74) *Attorney, Agent, or Firm*—Birch, Stewart, Kolasch & Birch, LLP

(57) ABSTRACT

A variable length encoding unit includes a run-length converter, a table memory, and a variable length encoder. The run-length converter converts block data consisting of a plurality of image signals into a zero-run number and a level value in accordance with a scanning sequence. The table memory stores a VLC (variable length code) and VLC length at an address corresponding to the zero-run number and level value. The variable length encoder reads the VLC and the VLC length from the table memory in response to the zero-run number and level value converted by the run-length converter, and carries out the variable length coding by cutting the VLC from the read data in accordance with the VLC length. The variable length coding unit can flexibly handle various types of variable length coding/decoding schemes including international standard coding methods without insisting on its unique variable length coding.

13 Claims, 10 Drawing Sheets

| ZERO-RUN NUMBER | LEVEL VALUE | NUMBER OF (ZERO-RUN + LEVEL)'S |
|---|---|---|
| 0 | 10 | 4 |
| 3 | 5 | |
| 0 | -1 | |
| 4 | 12 | |

FIG.4

| ADDRESS | DATA CONTENT | |
|---|---|---|
| 0000 | address0 (ZERO-RUN NUMBER=0) | |
| 0001 | address1 (ZERO-RUN NUMBER=1) | |
| 0002 | address2 (ZERO-RUN NUMBER=2) | |
| ... | ... | |
| ... | ... | |
| address0 | — | — |
| address0+1 | VLC OF (Run, \|Level\|)=(0, 1) | VLC LENGTH |
| address0+2 | VLC OF (Run, \|Level\|)=(0, 2) | VLC LENGTH |
| ... | ... | ... |
| address1 | — | — |
| address1+1 | VLC OF (Run, \|Level\|)=(1, 1) | VLC LENGTH |
| address1+2 | VLC OF (Run, \|Level\|)=(1, 2) | VLC LENGTH |
| ... | ... | ... |
| address2 | — | — |
| address2+1 | VLC OF (Run, \|Level\|)=(2, 1) | VLC LENGTH |
| address2+2 | VLC OF (Run, \|Level\|)=(2, 2) | VLC LENGTH |
| ... | ... | ... |

FIG.11A

| ADDRESS | DATA CONTENT | | |
|---|---|---|---|
| address1 | ZERO-RUN NUMBER=0 | LEVEL VALUE=1 | CODE LENGTH |
| address2 | ZERO-RUN NUMBER=0 | LEVEL VALUE=2 | CODE LENGTH |
| ... | ... | ... | ... |
| ... | ... | ... | ... |

CODING SCHEME A

FIG.11B

| ADDRESS | DATA CONTENT | | |
|---|---|---|---|
| address1 | ZERO-RUN NUMBER=0 | LEVEL VALUE=1 | CODE LENGTH |
| address2 | ZERO-RUN NUMBER=0 | LEVEL VALUE=2 | CODE LENGTH |
| ... | ... | ... | ... |
| ... | ... | ... | ... |

CODING SCHEME B

VARIABLE LENGTH CODING UNIT AND VARIABLE LENGTH DECODING UNIT

BACKGROUND OF THE INVENTION

1. Field of the Invention

The present invention relates to a variable length coding unit and a variable length decoding unit preferably applicable to motion pictures.

2. Description of Related Art

FIGS. 12 and 13 are block diagrams showing a configuration of a conventional Huffman coding unit and decoding unit disclosed in Japanese patent application laid-open No. 5-75477/1993. In these figures, the reference numeral 1 designates an information source for supplying information source symbols; and 2 designates a memory for storing the information source symbols. The reference numeral 3 designates a stochastic calculation quantizer for calculating an occurrence probability of the information source symbols; 4 designates an arithmetic circuit for summing up less-frequent occurrence probabilities; and 5 designates an arithmetic circuit for calculating the average of the summed up occurrence probabilities. The reference numeral 6 designates a Huffman table generator for generating a Huffman table; 7 designates a Huffman encoder for Huffman coding the information source symbols according to the Huffman table; and 8 designates a multiplexer for transmitting the Huffman code sequence along with more-frequent occurrence probabilities.

The reference numeral 11 designates a demultiplexer for separating the Huffman code sequence and more-frequent occurrence probabilities sent through the transmission line; and 12 designates a memory for storing the Huffman code sequence. The reference numeral 13 designates an arithmetic circuit for calculating the difference between one and the sum of the more-frequent occurrence probabilities; and 14 designates an arithmetic circuit for calculating the average of the value calculated by the arithmetic circuit 13. The reference numeral 15 designates a Huffman table generator for generating the Huffman table; and 16 designates a Huffman decoder for Huffman decoding the Huffman code sequence according to the Huffman table.

Next, the operation of the conventional units will be described.

First, referring to FIG. 12, the operation of the Huffman coding unit will be described.

The stochastic calculation quantizer 3 calculates the occurrence probabilities P(A)–P(E) of the information source symbols supplied from the information source 1. Among the calculated occurrence probabilities P(A)–P(E), less-frequent occurrence probabilities P(C)–P(E) are supplied to the arithmetic circuit 4 that sums them up. The arithmetic circuit 5 computes the average of the output of the arithmetic circuit 4, and supplies the Huffman table generator 6 with transmission probabilities P1(C)–P1(E). The Huffman table generator 6 generates the Huffman table from the more-frequent occurrence probabilities P(A) and P(B) fed from the stochastic calculation quantizer 3 and the transmission probabilities P1(C)–P1(E) fed from the arithmetic circuit 5. Then, the Huffman encoder 7 carries out the Huffman coding of the information source symbols in reference to the Huffman table generated by the Huffman table generator 6. The multiplexer 8 supplies the transmission line with the Huffman code sequence output from the Huffman encoder 7, along with the more-frequent occurrence probabilities P(A) and P(B).

Next, referring to FIG. 13, the operation of the Huffman decoding unit will be described.

The demultiplexer 11 separates the Huffman code sequence and more-frequent occurrence probabilities P(A) and P(B) from the information transmitted through the transmission line. The Huffman code sequence is stored in the memory 12, and the occurrence probabilities P(A) and P(B) are supplied to the arithmetic circuit 13 and Huffman table generator 15. The arithmetic circuit 13 calculates P(SUM)=1−{P(A)+P(B)}, the difference between one and the sum of the occurrence probabilities P(A) and P(B), and supplies it to the arithmetic circuit 14. The arithmetic circuit 14 calculates the less-frequently occurring transmission probabilities P1(C)–P1(E) from the calculation result P(SUM) supplied. In other words, it calculates the average P1(C)=P1(D)=P(E)=P(SUM)/3, thereby placing the transmission probabilities P1(C)–P1(E) at the same value. The Huffman table generator 15 generates the Huffman table in response to the occurrence probabilities P(A) and P(B) of the information source symbols and the transmission probabilities P1(C)–P1(E) computed by the arithmetic circuit 14. The Huffman decoder 16 carries out the Huffman decoding by reading the Huffman code sequence from the memory 12 in reference to the Huffman table generated by the Huffman table generator 15, and outputs an information source sequence.

FIG. 14 is a block diagram showing a configuration of a conventional image coding unit disclosed in Japanese patent application laid-open No. 8-256266/1996, and FIG. 15 is a block diagram showing the detail of its encoder. In these figures, the reference numeral 22 designates a target extractor for isolating and extracting a target image from an input image signal 21, and for outputting target image information 23; 24 designates a coding scheme decision section for selecting a coding scheme suitable for the target image information 23 from a plurality of coding schemes, and for outputting a selection signal 25; and 26 designates an encoder for encoding the target image information 23 according to the coding scheme corresponding to the selection signal 25, and for outputting coding information 27 and decoding scheme information 28.

In the coding section 26, reference numerals 31–34 designate encoders for carrying out different coding schemes; and 35 designates an encoder selector for selecting one of the encoders 31–34 in response to the selection signal 25.

Next, the operation of the conventional system will be described.

First, the operation of the image coding unit will be described with reference to FIG. 14.

The input image signal 21 is input to the target extractor 22 that isolates and extracts a plurality of target images constituting a frame. The extracted target image information 23 is supplied to the coding scheme decision section 24 that selects one of the plurality of coding schemes suitable to the target image information 23, and outputs the selection signal 25. Specifically, it selects the optimum coding scheme considering the type and complexity of the target images. It is also effective to select a coding scheme that provides a minimum information amount by comparing information amounts after encoding. On the other hand, as to a background including a scene of nature, it will be suitable to apply conventional orthogonal transform coding. The selection signal 25 determined by the coding scheme decision section 24 is input to the coding section 26.

In the coding section 26 as shown in FIG. 15, the encoder selector 35 selects the encoder for carrying out the coding scheme selected by the selection signal 25 from the n encoders 31–34 to perform the coding. The coding section 26 outputs the coding information 27 and decoding scheme information 28 obtained as a result of the coding.

With the foregoing configuration, the conventional Huffman coding unit and decoding unit divide the information source into the less-frequent occurrence probability information source symbols and more-frequent occurrence probability information source symbols, and as for the less-frequent occurrence probability information source symbols, it calculates the average of the less-frequent occurrence probability information source symbol sets as the transmission probability. Applying such a technique to information sources according to international standard coding methods such as H.261, H.263, MPEG1, MPEG2 and MPEG4 that include a great number of probabilities will increase the amount of the stochastic calculation. In addition, as for the information source symbols with the less-frequent occurrence probabilities, the number of symbol sets of the averaged transmission probability tends to increase.

Likewise, on the receiving side, as for the more-frequent occurrence probability information source, the calculation of the transmission probabilities in the decoding becomes complicated, and the Huffman table increases with the occurrence probabilities.

Furthermore, it is necessary for the transmitting side to transmit the occurrence probabilities to the receiving side. Thus, applying the conventional technique to the information source that employs the international standard coding method such as the H.261, H.263, MPEG1, MPEG2 and MPEG4, and hence has a great number of probabilities will impair the transmission efficiency. This is because when the number of information source symbols belonging to the more-frequent occurrence probabilities is large, the large number occurrence probabilities of the information source symbols must be transmitted to the receiving side, and besides, to switch to another new coding scheme during coding, the occurrence probabilities corresponding to the new coding scheme must be transmitted to the receiving side.

In addition, since the conventional system can handle only its own scheme, it cannot code or decode a stream with a format according to the international standard coding method such as the H.261, H.263, MPEG1, MPEG2 and MPEG4, thus lacking in flexibility and applicability to other coding schemes.

As for the conventional image coding unit as shown in FIGS. 14 and 15, it is configured such that it extracts the plurality of target images from the input image, applies coding schemes suitable to the individual extracted target images, and outputs information indicating the decoding schemes of the coding information along with the target images. In contrast, a system that communicates with a party station by utilizing the international standard coding method according to the H.261, H.263, MPEG1, MPEG2 or MPEG4 is based on the premise that it carries out the coding on a frame by frame basis (or using a plurality of frames as one sequence depending on the coding schemes). Therefore, the conventional system, which divides each frame into a plurality of target images utilizing different international standard coding methods, is incompatible with such a system.

Moreover, it is necessary for the conventional system to transmit the information about the decoding scheme (coding scheme) to the party frame by frame even when the scheme is not changed.

Finally, as described above in connection with the operation of the conventional system, "it is also effective to select the coding scheme that provides the minimum information amount by comparing the information amounts after coding". This poses a problem in that the conventional system requires a lot of processing to complete the coding of each frame, because it divides each frame into a plurality of target images, encodes them by the prepared coding schemes, and selects the scheme providing the minimum information amount.

SUMMARY OF THE INVENTION

The present invention is implemented to solve the foregoing problems. It is therefore an object of the present invention to provide a variable length coding unit and a variable length decoding unit capable of handling various types of variable length coding/decoding schemes including the international standard coding methods without insisting on its own unique variable length coding.

According to a first aspect of the present invention, there is provided a variable length coding unit comprising: a run-length converter for converting block data consisting of a plurality of image signals into combined data in accordance with a scanning sequence, each of the combined data including a number of consecutive insignificant coefficients and a value of a significant coefficient next to the consecutive insignificant coefficients; a table memory for storing a variable length code and its code length corresponding to the combined data at an address corresponding to the combined data; and variable length encoder for reading the variable length code and its code length from the table memory in accordance with the combined data converted by the run-length converter, and for carrying out variable length coding of the variable length code by cutting it from the read data in accordance with the code length.

Here, the variable length coding unit can further comprise: a buffer memory for recording variable length coded data passing through the variable length coding by the variable length encoder; a shifter for shifting the variable length coded data by a predetermined number of bits, when the variable length coded data stored in the buffer memory exceeds the predetermined number of bits; a data output section for outputting the variable length coded data undergoing the bit shift by the predetermined number of bits by the shifter; and a processor for activating and controlling at least part of the run-length converter, the variable length encoder, the buffer memory, the shifter and the data output section.

The table memory can have a word width of L bits, and store the variable length code with a maximum length of m bits from a most significant bit side of the L-bit width, and its code length with a length of n bits from the least significant bit side of the L-bit width, where L is a given natural number, and m and n are natural numbers satisfying $L=m+n$.

The variable length encoder can comprise a variable length coded data cutting section for reading the n-bit code length of the variable length code from the least significant bit side of the L-bit width of the table memory, and for cutting the variable length code from the most significant bit side by a length indicated by the code length.

The table memory may add non-significant bits to an end of a variable length code with a length of less than m bits to make it m-bit data.

The processor may carry out, for a less-frequently occurring event, coding of a fixed length code corresponding to the event.

The processor may carry out part of a series of variable length coding processings.

According to a second aspect of the present invention, there is provided a variable length decoding unit comprising: a bit stream register for storing a received bit stream; a table memory for storing a code length of each variable length code in connection with combined data including a number of consecutive insignificant coefficients and a value of a significant coefficient next to the consecutive insignificant coefficients in accordance with a scanning sequence of block data consisting of a plurality of image signals; a data reader for reading a predetermined number of bits from the bit stream register; an address generator for generating an address of the table memory from data read from the data reader; and a variable length decoder for reading data from the address of the table memory generated by the address generator, and for carrying out variable length decoding by cutting from the data the number of the consecutive insignificant coefficients, the value of the significant coefficient and the code length of the variable length code.

The variable length decoding unit can further comprise: a shifter for shifting data in the bit stream register by the code length of the variable length code that is cut by the variable length decoder, to discard data by the length of the variable length code passing through the variable length decoding; a bit stream capturing section for inserting the received bit stream into the bit stream register without leaving any spacing between bits when the bit stream register has a space greater than a predetermined number of bits; an image signal generator for generating the block data consisting of the plurality of image signals in response to the number of the consecutive insignificant coefficients and the value of the significant coefficient passing through the variable length decoding by the variable length decoder in accordance with the scanning sequence; and a processor for activating and controlling at least part of the bit stream register, the data reader, the address generator, the variable length decoder, the shifter, the bit stream capturing section and the image signal generator.

Here, the table memory may store data that changes its bit fields associated with the number of the consecutive insignificant coefficients, with the value of the significant coefficient and with the code length of the variable length code in accordance with a coding scheme used for connecting to a party station.

The shifter may shift data in the bit stream register toward a most significant bit side, and the bit stream capturing section may insert a bit stream into the bit stream register beginning from the most significant bit side without leaving any spacing between bits.

The bit stream capturing section may insert the bit stream by a predetermined number of bits.

The bit stream register may have a word width of N bits, and when inserting a bit stream whose number of significant bits is less than N into the bit stream register, the bit stream capturing section may add non-significant bits to an end of the bit stream to make the bit stream N bits wide, where N is a given natural number.

The processor may carry out decoding processing of a fixed length code.

The processor may carry out part of a series of variable length decoding processings.

BRIEF DESCRIPTION OF THE DRAWINGS

FIG. 4 is a table illustrating data contents in a table memory;

FIGS. 11A and 11B are tables illustrating data contents of a table memory of an embodiment 8 in accordance with the present invention;

DETAILED DESCRIPTION OF THE PREFERRED EMBODIMENTS

The invention will now be described with reference to the accompanying drawings.

Embodiment 1

Figure 1:
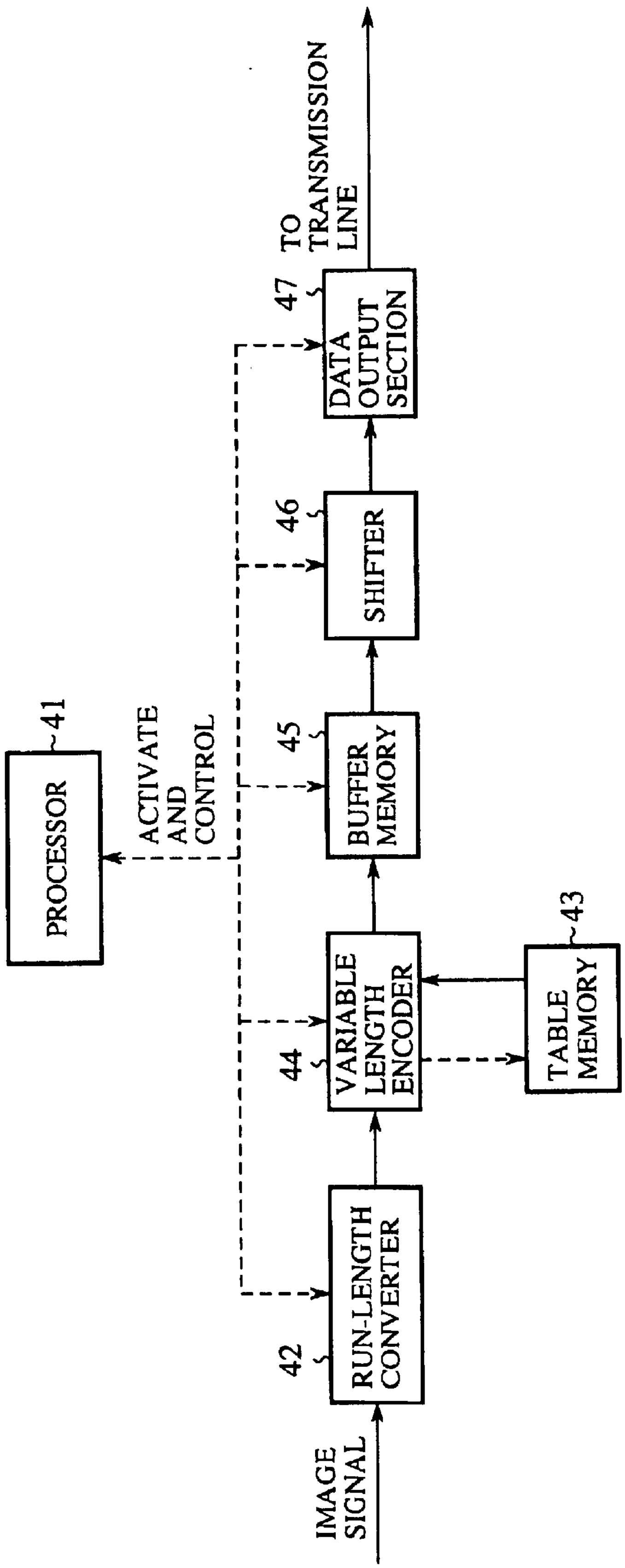
FIG. 1 is a block diagram showing a configuration of an embodiment 1 of the variable length coding unit in accordance with the present.

FIG. 1 is a block diagram showing a configuration of an embodiment 1 of the variable length coding unit in accordance with the present. In this figure, the reference numeral 41 designates a processor for activating and controlling individual sections or part thereof; 42 designates a run-length converter for converting data in a series of blocks consisting of a plurality of image signals into combination data of the number of consecutive insignificant coefficients (called zero-run number from now on) with a value of a significant coefficient (called "level value" from now on) in accordance with the scanning sequence. The reference numeral 43 designates a table memory for storing a variable length code and its code length at the address corresponding to the combination data of the zero-run number and level value; and 44 designates a variable length encoder for reading the variable length code and its code length from the table memory 43 in accordance with the combination data of the zero-run number and level value converted by the run-length converter 42, and for cutting the variable length code from the read data in accordance with the code length, thereby carrying out variable length coding of the read variable length code. The reference numeral 45 designates a buffer memory for storing the variable length coded data passing through the variable length coding by the variable length encoder 44 successively without spaces; 46 designates a shifter for shifting, when the variable length coded data is stored in the buffer memory 45 by a predetermined number of bits, the data by that predetermined number of bits; and 47 designates a data output section for supplying a transmission line with the variable length coded data shifted by the predetermined number of bits by the shifter 46.

Next, the operation of the present embodiment 1 will be described.

In the present embodiment 1, the processor 41 activates and controls the sections other than the table memory 43 by its command.

Figures 2, 3:
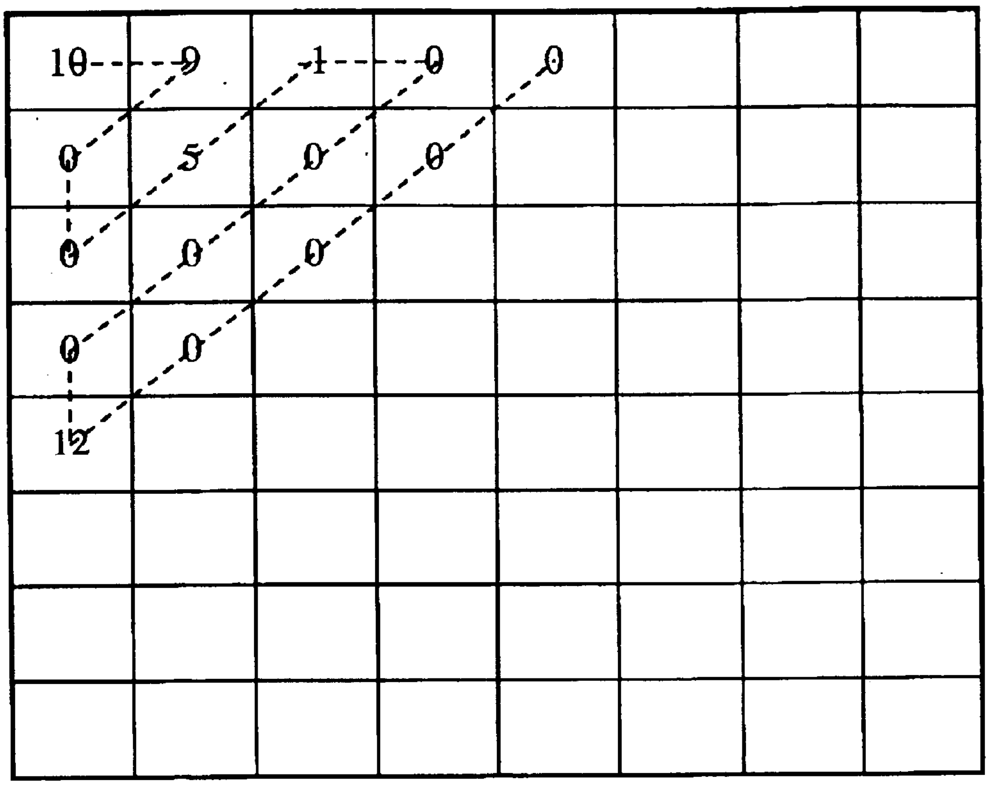
FIG. 2 is a diagram illustrating a data scanning sequence on an 8×8 pixel block.
FIG. 3 is a table illustrating zero-run numbers, level values and the number of combinations of the zero-run number and level value.

The present embodiment 1 handles, as its input image signal, an 8×8 pixel square block that is typically employed in the international standard coding method such as H.261 or MPEG2. FIG. 2 is a diagram illustrating a data scanning sequence of an 8×8 pixel block. In FIG. 2, the data of a square without any digit is invalid data "zero".

The run-length converter 42, scanning each pixel zigzag as illustrated in FIG. 2, checks whether it has a significant coefficient (non-zero coefficient: level value) or an insignificant coefficient (zero coefficient), counts the number of the insignificant coefficients (zero-run number) up to the next significant coefficient, and outputs the zero-run number and the level value. FIG. 3 is a table illustrating the zero-run numbers and level values in FIG. 2, along with the number of combinations of the zero-run number and level value. As illustrated in FIG. 3, the number of combinations of the zero-run number and level value is four in the example of FIG. 2.

FIG. 4 is a table illustrating the data contents of the table memory. The table memory includes addresse0, address1, address2, . . . corresponding to the zero-run numbers=0, 1, 2, . . . . To these addresses are added the absolute values of the level values to obtain addresses that store variable length codes (VLCs) corresponding to the combinations of the zero-run number and level value and their code lengths (VLC lengths). Here, as for the more-frequently occurring combinations of the zero-run number and level value, the code lengths of their variable length codes are set shorter, whereas as for the less-frequently occurring combinations of the zero-run number and level value, the code lengths of their variable length codes are set longer.

The variable length encoder 44 reads data from the table memory 43 using the zero-run number fed from the run-length converter 42 as the address. The read data points the top address of the area storing the variable length code corresponding to the zero-run number and its code length. In the example as illustrated in FIG. 4, when the zero-run number is zero, the pointer "address 0" is read, first, and then the data of the table memory 43 is read from the address obtained by adding the absolute value of the level value to the "address0" (address0+the absolute value of the level). The data read in this case is the VLC corresponding to (Run, |Level|) and the VLC length. The variable length encoder 44 cuts the VLC by a length indicated by the VLC length from the data read from the table memory 43, and writes it to the buffer memory 45.

Figure 5:
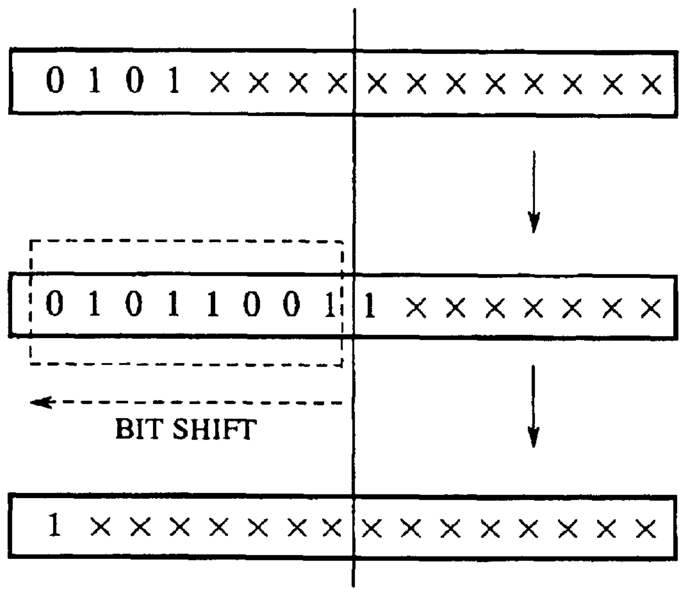
FIG. 5 is a diagram illustrating data update operation of a 16-bit wide buffer memory.

FIG. 5 is a diagram illustrating the data update of a 16-bit wide buffer memory. When the first code undergoing the variable length coding is "0101", the buffer memory 45 stores the code "0101" as illustrated at the top of FIG. 5. When the next code undergoing the variable length coding is "10011", it stores the code "10011" next to "0101" without leaving any space between them as illustrated in the middle of FIG. 5. Subsequently, the processor 41 makes a decision as to whether the data stored in the buffer memory 45 exceeds half of the bit width of the buffer memory 45 as illustrated in the middle of FIG. 5, and when it exceeds, the data corresponding to half the bit width of the buffer memory 45 enclosed by broken lines is shifted by the shifter 46 as illustrated at the bottom of FIG. 5. The data with the length of half the bit width of the buffer memory 45 shifted by the shifter 46 is transferred to the transmission line by the data output section 47.

Although the present embodiment 1 specifies the bit width of the buffer memory 45 at 16 bits as illustrated in FIG. 5, other bit width is applicable. Thus, it does not limit the contents of the present invention.

Although the processor 41 makes a decision as to whether the data stored in the buffer memory 45 exceeds half the bit width of the buffer memory 45, and when it exceeds, the data output section 47 transfers the data by half the bit width in the buffer memory 45 to the transmission line in the present embodiment 1, the threshold value about the stored data in the buffer memory 45 can be ¼ or ⅔ of the bit width of the buffer memory 45, or any other value. Thus, it does not limit the contents of the present invention.

In addition, although the processor 41 makes a decision as to whether the data stored in the buffer memory 45 exceeds half the bit width of the buffer memory 45 in the present embodiment 1, a counter for counting the number of bits of the data stored in the buffer memory 45 can be installed, instead. Thus, the decision method does not limit the contents of the present invention.

Furthermore, although the processor 41 activates and controls the sections other than the table memory 43 in the present embodiment 1, the processor 41 can also carry out bus management or memory access control. Thus, this does not limit the contents of the present invention.

Moreover, although the processor 41 activates and controls them through a command, it can deliver start and control signal instead. Thus, the control manner does not limit the present invention.

In addition, although the present embodiment 1 scans the image signal as illustrated in FIG. 2, the scanning of the image signals can be carried out in other sequences. Thus, it does not limit the present invention.

Furthermore, although the present embodiment 1 handles the input image signals in terms of the 8×8 pixel square blocks, it can handle other image signal sets. Thus, the structure of the input image signals does not limit the present invention.

In addition, when carrying out coding by selecting some of the international standard coding methods, it is possible to select efficient coding schemes by negotiation with the party station, and to load the variable length coded data based on the selected coding scheme onto the table memory 43 to implement the variable length coding. Thus, it is not necessary to load all the various types of the variable length coded data on the table memory 43 in advance. Thus, this does not limit the contents of the present invention.

As described above, according to the present embodiment 1, the processor 41 activates and controls the sections of the system or part thereof so that the table memory 43 can store the data corresponding to the various types of the coding schemes. Thus, it is unnecessary for the system to insist on its unique variable length coding, making it possible for the system to handle various types of variable length coding/decoding including the international standard coding methods.

Furthermore, since the buffer memory 45 stores the variable length coded data successively without space, and the shifter 46 shifts the variable length coded data stored in the buffer memory 45 by the predetermined number of bits when the data exceeds the predetermined number of bits, the buffer memory 45 can be used efficiently.

Embodiment 2

Figure 6:
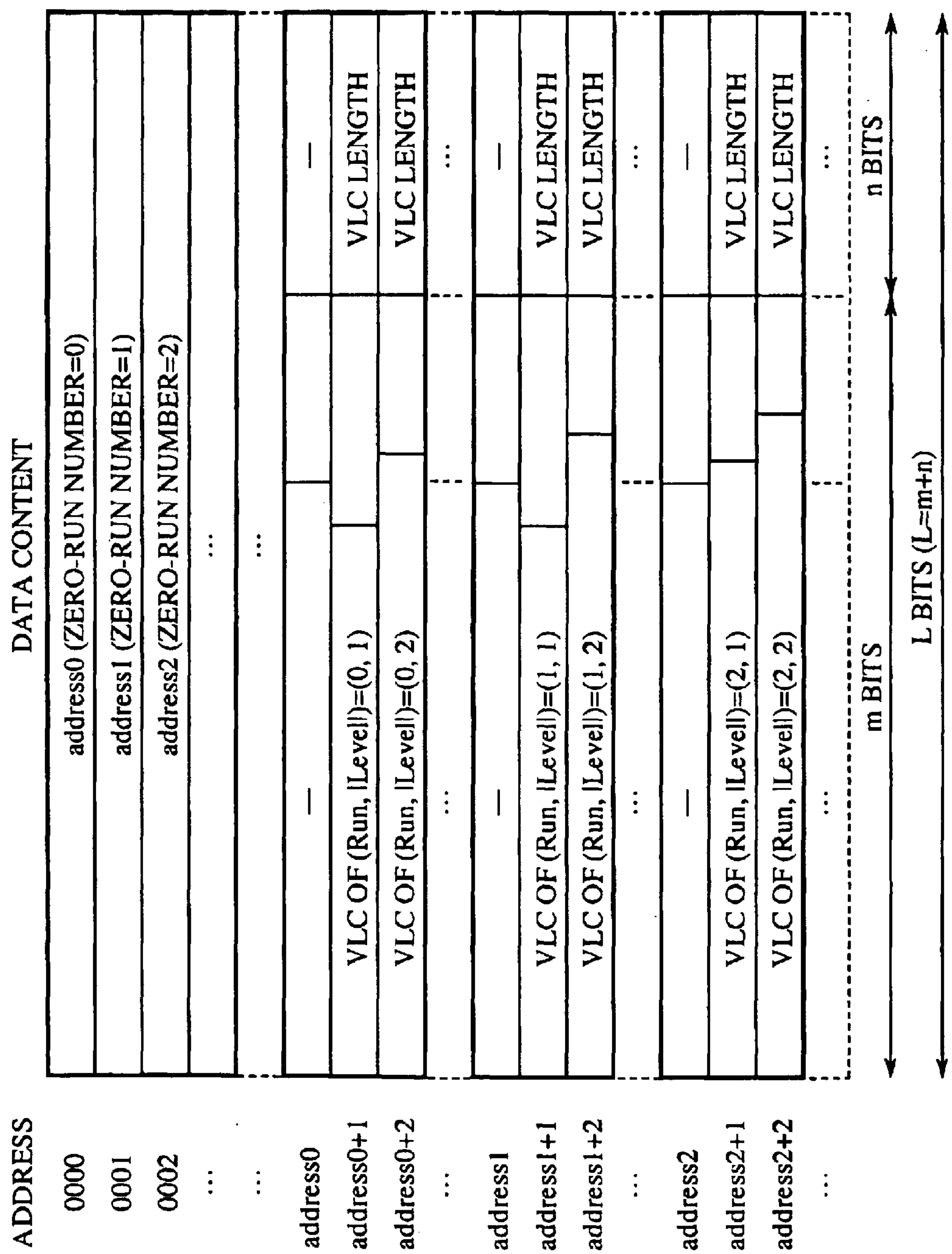
FIG. 6 is a table illustrating data contents of a table memory of an embodiment 2 in accordance with the present invention.

FIG. 6 is a table illustrating data contents of the table memory of an embodiment 2 in accordance with the present invention. Each word of the table memory 43 is L bits long, where L is a given natural number. The VLCs with a length equal to or less than m bits are stored from the most significant bit side, whereas the VLC lengths with a length of n bits are stored from the least significant bit side, where m and n are natural numbers satisfying L=m+n.

Next, the operation of the present embodiment 2 will be described.

Although the foregoing embodiment 1 does not designate the storing format of the data, each consisting of the VLC and VLC length stored in the table memory 43 as illustrated in FIG. 4, the present embodiment 2 stores the VLCs from the most significant bit side and the VLC lengths from the least significant bit side as illustrated in FIG. 6. Each word of the table memory 43 has a length of L bits, the m bits on the most significant bit side of which are reserved for storing the VLC, whereas the n bits on the least significant bit side of which are reserved for storing its VLC length, where L=m+n. Although a VLC with a length less than m bits can be stored from the least significant bit side of the m-bit area, it is stored from the most significant bit side as illustrated FIG. 6 in the present embodiment 2.

As described above, according to the present embodiment 2, the table memory 43 stores the VLCs from the most significant bit side, whereas it stores the VLC lengths from the least significant bit side. Thus, it facilitates reading the VLC and VLC length from the table memory 43.

Embodiment 3

Figure 7:
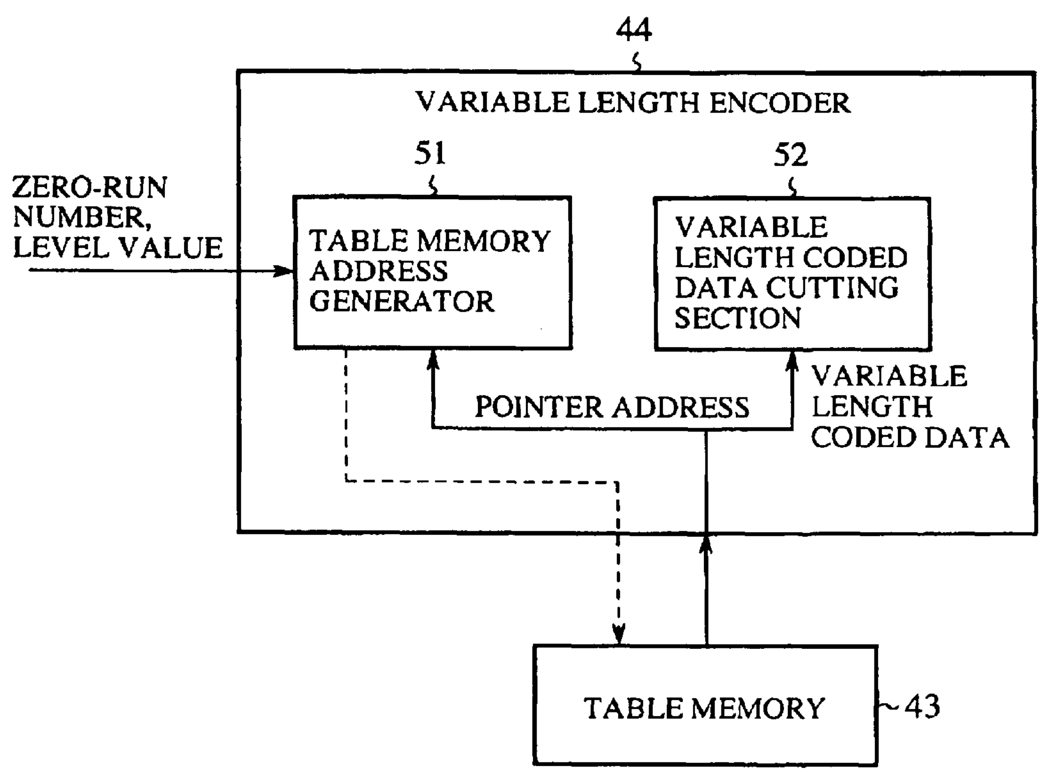
FIG. 7 is a block diagram showing a detailed configuration of a variable length encoder of an embodiment 3 in accordance with the present invention.

FIG. 7 is a block diagram showing a detailed configuration of a variable length encoder of an embodiment 3 in accordance with the present invention. In this figure, the reference numeral 51 designates a table memory address generator for generating an address of the table memory 43 in response to the zero-run number and level value; and 52 designates a variable length coded data cutting section for reading the n-bit long VLC length from the least significant bit side in the generated address of the table memory 43, and for cutting the VLC with a length indicated by the VLC length from the most significant bit side thereof.

Next, the operation of the present embodiment 3 will be described.

To read the VLC from the table memory 43 as illustrated in FIG. 6 using the circuit as shown in FIG. 7, the table memory address generator 51 calculates the address from the zero-run number, and reads the top pointer of the area storing the VLC corresponding to the address from the table memory 43. The table memory address generator 51 calculates the address by adding the level value to the content of the top pointer so that the variable length coded data cutting section 52 reads the data from the address calculated by the table memory 43. The read data has the structure as illustrated in FIG. 6: It includes the VLC stored from the most significant bit side within the m-bit area in the L-bit wide word. Accordingly, the variable length coded data cutting section 52 cuts the VLC from the most significant bit side in the L-bit wide word by the VLC length stored in the n-bit area on the least significant bit side.

Although the address generation and variable length coded data cutting are carried out by the table memory address generator 51 and variable length coded data cutting section 52 in the variable length encoder 44 in the present embodiment 3, they can be carried out by other sections such as the processor 41. Thus, they do not limit the present invention.

As described above, according to the present embodiment 3, the variable length coded data cutting section 52 reads the VLC length from the n-bit area at the least significant bit side in the table memory 43, and cuts the VLC from the most significant bit side by the VLC length. This can facilitate reading the VLC from the table memory 43.

Embodiment 4

In the present embodiment 4, non-significant bits are added to the end of a variable length code of less than m-bit length to convert it to m-bit long data in the table memory 43.

Next, the operation of the present embodiment 4 will be described.

Although the VLCs are stored from the most significant bit side as illustrated in FIG. 6 in the foregoing embodiment 2, they are not always m bits in length. In view of this, the VLCs of less than m bits long in FIG. 6 are made m bits long by adding non-significant bits ("0" in the present embodiment 4) to their ends. The non-significant bits are added so that the sum of the m-bit long variable length code storing area and the n-bit long code length storing area becomes equal to the L-bit long word length of the table memory 43, where L=m+n.

As described above, according to the present embodiment 4, the non-significant bits are added to the end of the variable length codes of less than m bits long in the table memory 43 to make them m-bit long data. Therefore, all the data stored in the table memory 43 are aligned in their length to the bit width of its words. Thus, it can carry out unified data transfer, facilitating the data handling.

Embodiment 5

In the present embodiment 5, for a less-frequently occurring event, the processor 41 carries out the coding processing of a fixed length code corresponding to the event.

Next, the operation of the present embodiment 5 will be described.

Although the variable length codes are handled in the foregoing embodiments, the international standard coding methods such as the H.261 and MPEG2 sometimes carry out coding of fixed length codes instead of assigning variable length codes to less-frequently occurring events. The processor 41 makes a decision as to whether the event is a less-frequently occurring event, and for the less-frequently occurring event, it carries out the coding processing to output the fixed length code. This is because causing the processor 41, which can perform more flexible processing by software, to carry out the coding processing is more efficient in terms of the processing time than to install a processing section that operates rarely for coding the less-frequently occurring events.

As described above, according to the present embodiment 5, the processor 41 carries out the fixed length coding corresponding to the less-frequently occurring events. Thus, it can perform the coding processing of the less-frequently occurring events more efficiently.

Embodiment 6

In the present embodiment, the processor 41 carries out part of the series of the variable length coding processings.

Next, the operation of the present embodiment 6 will be described.

Although the foregoing embodiments perform the series of the variable length coding processings using the various sections as described above, the processor 41 can carry out the address generation, shift processing and part of other processings. It is obvious, however, that it is inefficient for the processor 41 to perform the entire variable length coding processings in sequence because the processor 41 carries out the control of the various sections as shown in FIG. 1 considering their parallel processings.

As described above, the present embodiment 6 is configured such that the processor 41 carries out part of the series of the variable length coding processings. Thus, the processor 41 and the remaining various sections can perform the parallel and distributed processings, thereby improving the efficiency of the total processing.

Embodiment 7

Figure 8:
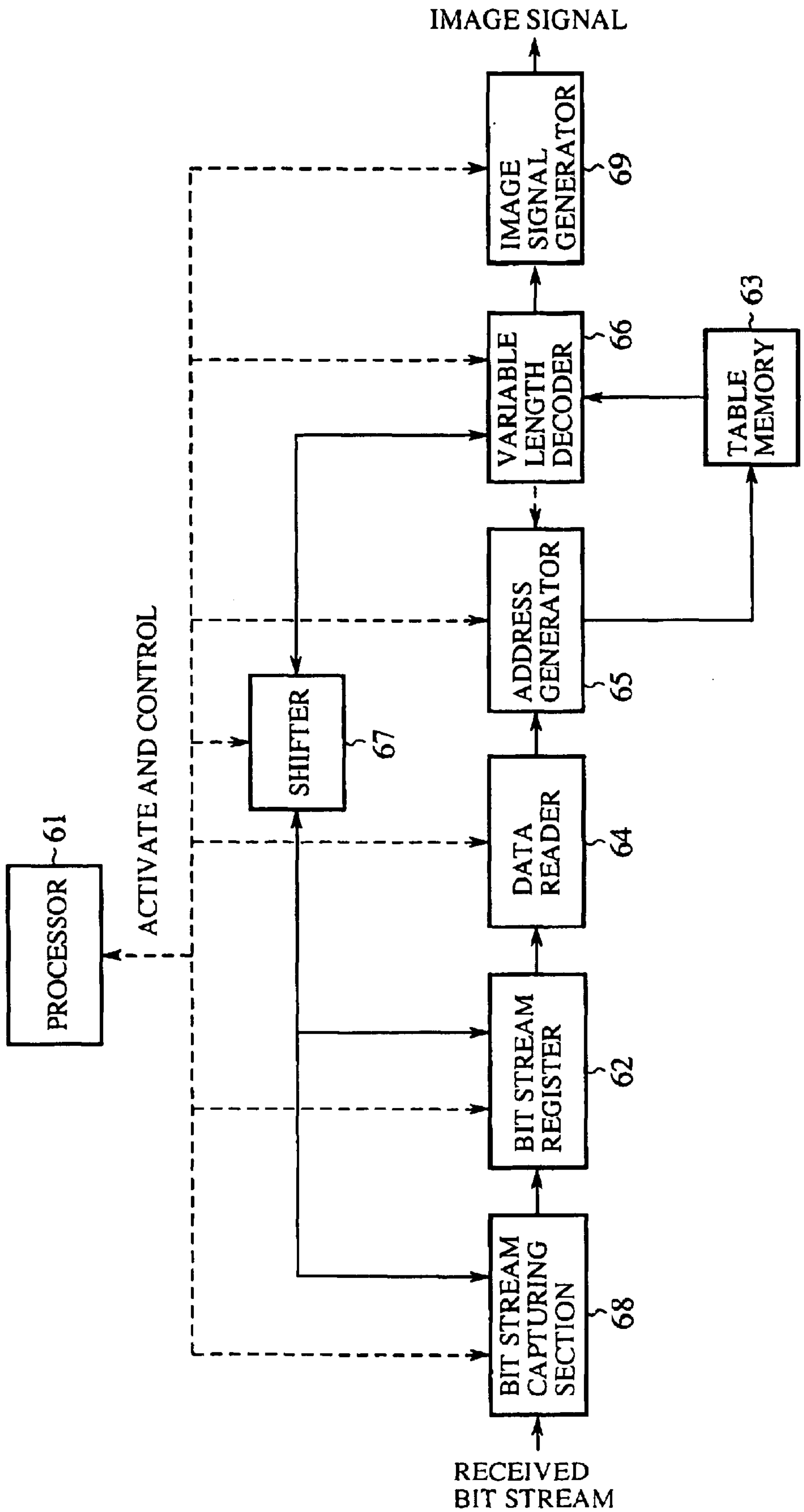
FIG. 8 is a block diagram showing a configuration of an embodiment 7 of the variable length coding unit in accordance with the present invention.

FIG. 8 is a block diagram showing a configuration of an embodiment 7 of a variable length decoding unit in accordance with the present invention. In this figure, the reference numeral 61 designates a processor for activating and controlling the various sections or a part thereof; and 62 designates a bit stream register for storing a received bit stream. The reference numeral 63 designates a table memory for storing data items each including the number of consecutive insignificant coefficients (zero-run number), the value of a significant coefficient (level value) and the code length of the variable length code corresponding to their combination, the data items taking place according to the scanning sequence of the block data consisting of a plurality of image signals; and 64 designates a data reader for reading a predetermined number of bits from the bit stream register 62. The reference numeral 65 designates an address generator for generating an address of the table memory 63 from the data read by the data reader 64; and 66 designates a variable length decoder for carrying out variable length decoding by reading data from the address of the table memory 63 generated by the address generator 65, and by cutting the zero-run number, the level value and the code length of the variable length code from the address data. The reference numeral 67 designates a shifter for shifting the data in the bit stream register 62 by the code length of the variable length code output from the variable length decoder 66 to discard the data by the length of the variable length code passing though the variable length decoding; 68 designates a bit stream capturing section for receiving a bit stream, and for inserting the received bit stream into the bit stream register 62 without space between the bits when the bit stream register has a space more than a predetermined number of bits; and 69 designates an image signal generator for generating block data consisting of a plurality of image signals according to the scanning sequence from the zero-run number and the level value passing through the variable length decoding by the variable length decoder 66.

Next, the operation of the present embodiment 7 will be described.

In the present embodiment 7, the processor 61 activates and controls the sections other than the table memory 63 by its command.

The present embodiment 7 handles, as its output image signals, 8×8 pixel square blocks that are typically employed in the international standard coding method such as H.261 or MPEG2.

The received bit stream is captured into the 16-bit wide bit stream register 62 by the bit stream capturing section 68.

Figure 9:
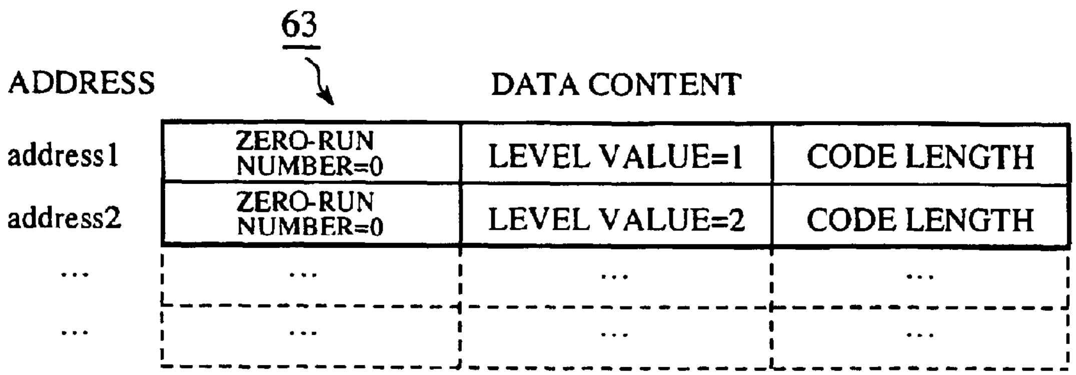
FIG. 9 is a table illustrating data contents in a table memory.

FIG. 9 is a diagram illustrating data contents in the table memory 63. As illustrated in FIG. 9, each word of the table memory 63 includes the zero-run number, the level value and the code length corresponding to the variable length code. The data reader 64 reads the predetermined number of bits needed for the addressing from the bit stream register 62, and supplies the data to the address generator 65.

In response to the address output request for the table memory 63 the variable length decoder 66 issues to the address generator 65, the address generator 65 sends the data supplied from the data reader 64 to the table memory 63 as the address.

The variable length decoder 66 reads the data corresponding to the address from the table memory 63. In this case, since the zero-run number, level value and code length corresponding to the variable length code are stored as one word as illustrated in FIG. 9, they are cut from the word as independent data so that the code length is supplied to the shifter 67, and the zero-run number and level value are supplied to the image signal generator 69.

The shifter 67 shifts and discards the data in the bit stream register 62 by a length indicated by the code length supplied from the variable length decoder 66, that is, by the code length of the variable length code passing through the decoding by the variable length decoder 66. Then, the shifter 67 notifies the bit stream capturing section 68 of the discarded code length.

Figure 10:
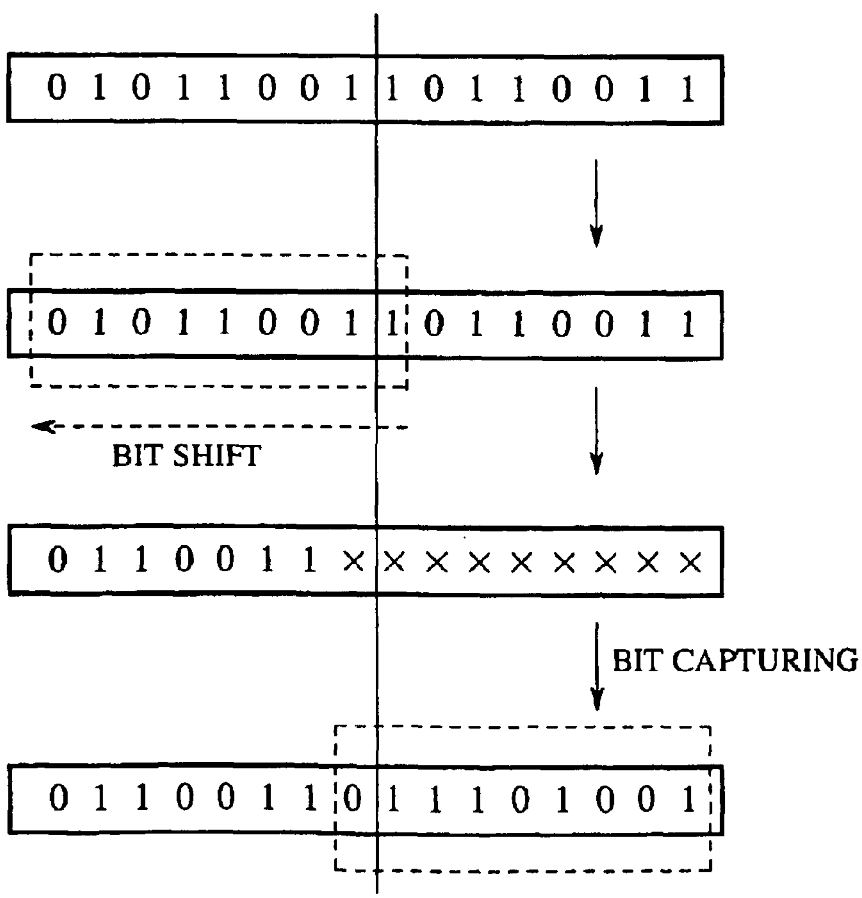
FIG. 10 is a diagram illustrating data update operation of a bit stream register.
Figure 12:
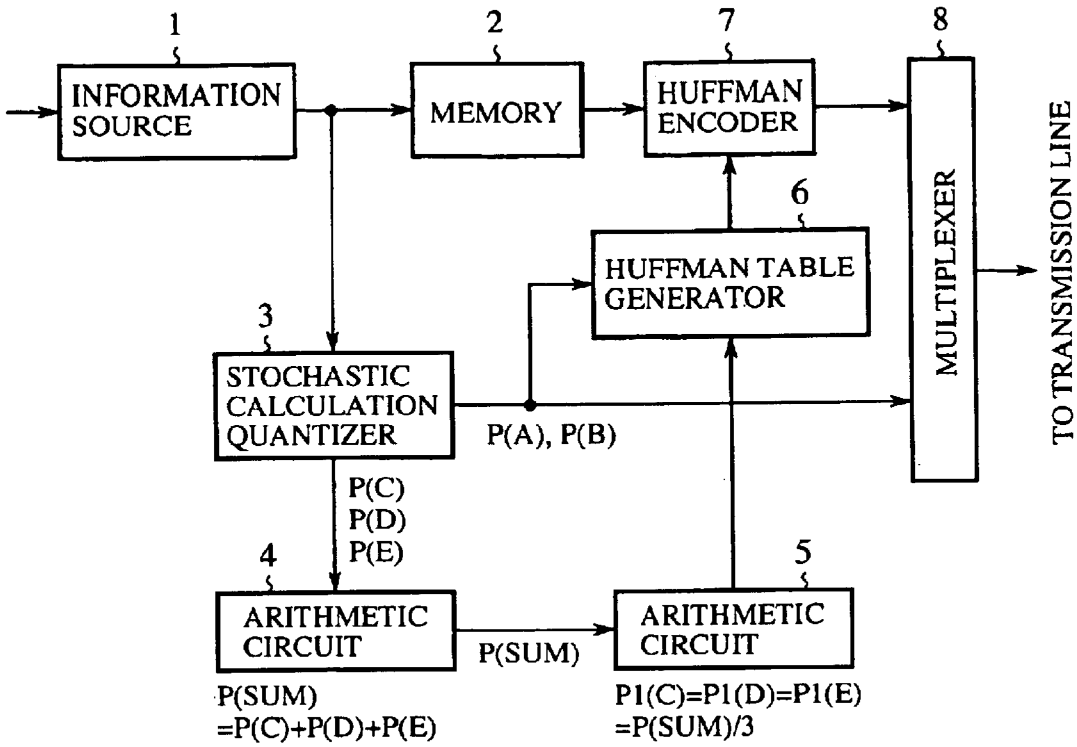
FIG. 12 is a block diagram showing a configuration of a conventional Huffman coding unit.
Figure 13:
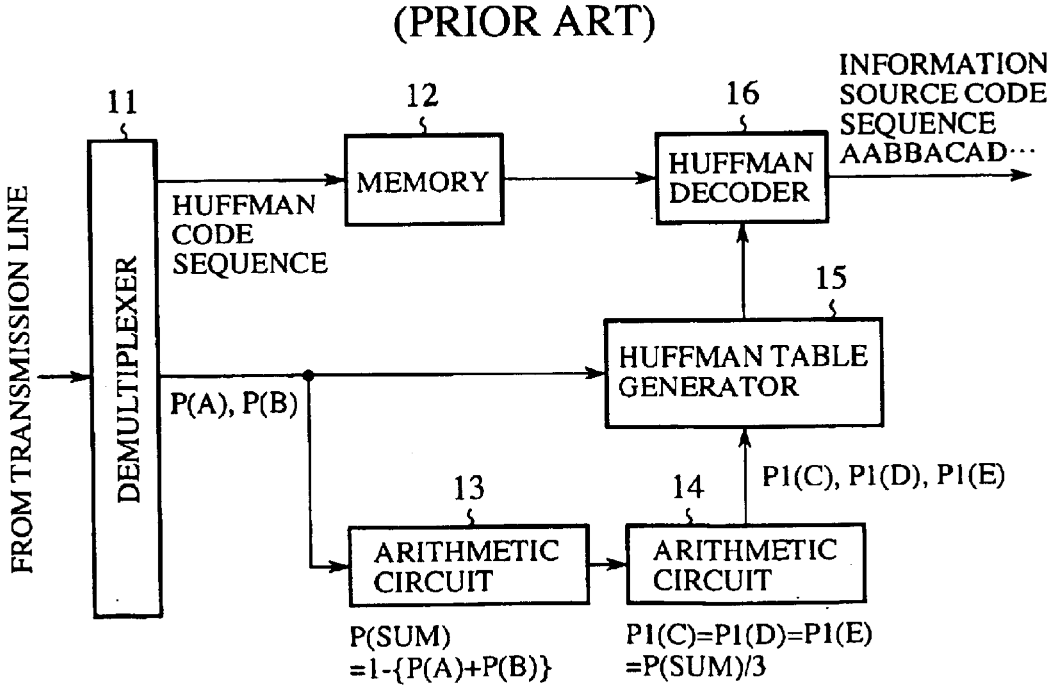
FIG. 13 is a block diagram showing a configuration of a conventional Huffman decoding unit.
Figure 14:
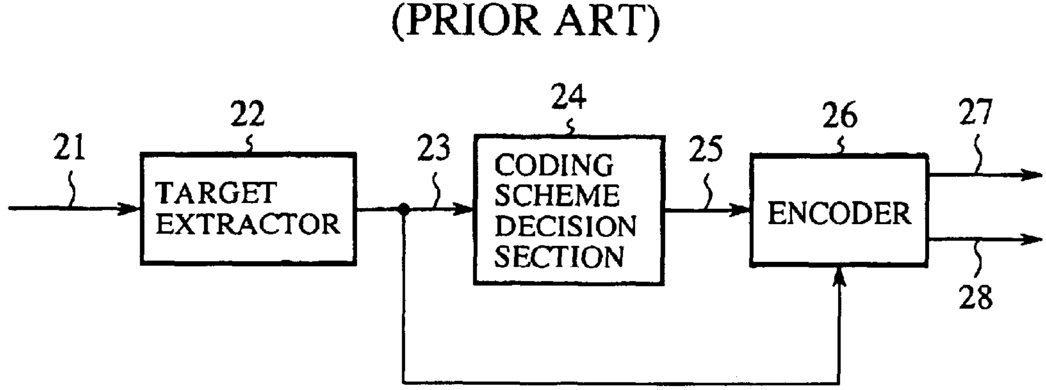
FIG. 14 is a block diagram showing a configuration of a conventional image coding unit.
Figure 15:
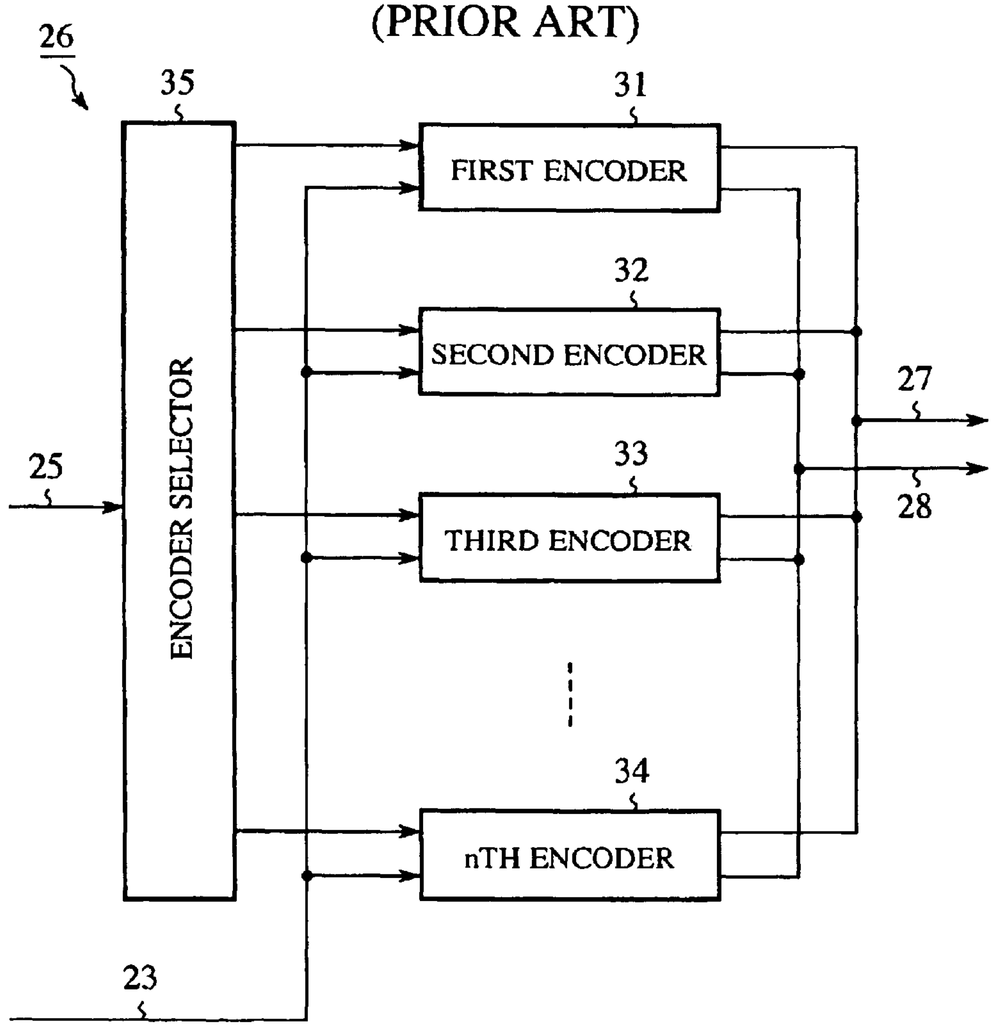
FIG. 15 is a block diagram showing a detailed configuration of a conventional encoder.

FIG. 10 is a diagram illustrating a process of the data update operation of the bit stream register. It is assumed that the bit stream register 62 stores the data "0101100110110011" as illustrated at the top of FIG. 10. When the code passing through the variable length decoding by the variable length decoder 66 is a 9-bit code "010110011", the shifter 67 shifts to discard the 9-bit data currently passing through the variable length decoding from the bit stream register 62 (the transition from the second to third row of FIG. 10). The bit stream capturing section 68 sums up the code lengths supplied from the shifter 67, and makes a decision as to whether the total code length exceeds half the bit width of the bit stream register 62 (8 bits). In the example of FIG. 10, since the code length decoded is nine bits, it exceeds half the data width of the bit stream register 62. Thus, the bit stream capturing section 68 writes code(s) by nine bits from the received bit stream into the bit stream register 62 as illustrated at the bottom of FIG. 10. Then, the bit stream capturing section 68 clears the code length total to zero.

The image signal generator 69 generates the image signals in accordance with the input zero-run numbers and the level values in the scanning sequence as illustrated in FIG. 2.

Although the present embodiment 7 specifies the bit width of the bit stream register at 16 bits, other bit width is applicable. Thus, it does not limit the contents of the present invention.

In addition, although the present embodiment 7 handles the 8×8 pixel square blocks as the output image signals, it can handle other image signal sets. Thus, the structure of the input image signals does not limit the present invention.

Furthermore, although the data reader 64, address generator 65 and variable length decoder 66 are installed separately in the present embodiment 7, they can be integrated into the variable length decoder 66 to carry out their processings. Thus, their configuration does not limit the present invention.

Although the bit stream capturing section 68 makes a decision as to whether the data stored in the bit stream register 62 exceeds half the bit width of the bit stream register 62, and when it exceeds, the bit stream capturing section 68 transfers the new bit stream to the bit stream register 62 by the total code length, the threshold value about the stored data in the bit stream register 62 can be ¼ or ⅔ of the bit width of the bit stream register 62, or any other value. Thus, it does not limit the contents of the present invention.

In addition, although the bit stream capturing section 68 makes a decision as to whether the data stored in the bit stream register 62 exceeds half the bit width of the bit stream register 62 in the present embodiment 7, the processor can make the decision instead. Thus, the decision means does not limit the contents of the present invention.

Furthermore, although the present embodiment 7 scans the image signals as illustrated in FIG. 2, the scanning of the image signals can be carried out in other sequences. Thus, it does not limit the present invention.

Besides, although the processor 61 activates and controls the sections other than the table memory 63 in the present embodiment 7, the processor 61 can also carry out bus management or memory access control. Thus, this does not limit the contents of the present invention.

Moreover, in the present embodiment 7, it is enough for the memory table 63 to load only the variable length coded data based on the coding schemes determined by negotiation with the party station, thereby obviating the need for loading the various types of the variable length coded data on the table memory 63 in advance. Thus, this aspect does not limit the contents of the present invention.

As described above, according to the present embodiment 7, the processor 61 activates and controls the various sections of the system or part thereof, and the table memory 63 stores the data corresponding to the various types of the coding schemes. Thus, it is unnecessary for the decoding unit to insist on its own unique variable length coding, making it possible for the decoding unit to handle various types of variable length coding/decoding including the international standard coding methods.

Furthermore, it is configured such that the shifter 67 shifts the data in the bit stream register 62 by the code length of the variable length code cut by the variable length decoder 66 to discard data by the length of the variable length code passing through the variable length decoding, and the bit stream capturing section 68 inserts, when the bit stream register 62 has a space greater than the predetermined number of bits, the received bit stream into the bit stream register 62 by the length of the space without leaving spacing between the bits. Thus, the bit stream register 62 can be used efficiently.

Moreover, since the bit stream capturing section 68 and variable length decoder 66 carry out the bit stream capturing and decoding processing in parallel, the present embodiment 7 can carry out the processing efficiently.

Embodiment 8

FIGS. 11A and 11B are diagrams illustrating data contents of the table memory in the embodiment 8 in accordance with the present invention. In these figures, according to coding schemes A and B used for connecting to a party station, the table memory 63 stores its data with changing the bit fields of the zero-run number, level value and code length of the variable length code.

Next, the operation of the present embodiment 8 will be described.

Although the embodiment 7 employs the table memory 63 as illustrated in FIG. 9, bit field data different from those used in FIG. 9 can be required depending on the coding scheme used for connecting to the party station. Preparing the data as illustrated in FIGS. 11A and 11B makes it possible to deal with such different coding schemes. In this case, it is enough for the table memory 63 to load only the data corresponding to the coding scheme used for connecting to the party station. It is obvious that it is unnecessary for the table memory 63 to store in advance all the data it handles. Thus, this aspect does not limit the present invention.

As described above, according to the coding schemes A and B used for connecting to the party station, the present embodiment 8 changes the data stored in the bit fields of the zero-run number, level value and code length of the variable length code in the table memory 63. Thus, it can deal with the coding schemes determined by the negotiation with the party station flexibly.

Embodiment 9

In the present embodiment 9, the shifter 67 shifts the data in the bit stream register 62 toward the most significant bit side, and the bit stream capturing section 68 inserts the bit stream into the space of the bit stream register 62 from the most significant bit side of the space without leaving any spacing between the bits.

Next, the operation of the present embodiment 9 will be described.

Although the shift direction (data discard direction) of the bit stream register 62 by the shifter 67 is not specified in the foregoing embodiment 7, the left-hand side in FIG. 10 can be made the most significant bit side. Thus, the shift direction does not limit the present invention.

As described above, according to the present embodiment 9, the shifter 67 shifts the data in the bit stream register 62 toward the most significant bit side, and the bit stream capturing section 68 inserts the bit stream into the space of the bit stream register 62 from the most significant bit side of the space without leaving any spacing between the bits. Thus, the present embodiment 9 can facilitate the bit stream processing in the bit stream register 62.

Embodiment 10

In the present embodiment 10, the bit stream capturing section 68 inserts the bit stream to the bit stream register 62 by the predetermined number of bits.

Next, the operation of the present embodiment 10 will be described.

Although in the foregoing embodiments, the bit stream capturing section 68 transfers the additional data to the bit stream register 62 by the total code length from the received bit stream when the total code length exceeds half the data width of the bit stream register 62, it can always write the data by half the data width (eight bits) of the bit stream register 62, instead. Thus, the conditions or the bit width for adding the new bit stream does not limit the present invention.

As described above, according to the present embodiment 10, the bit stream capturing section 68 inserts the bit stream into the bit stream register 62 by the predetermined number of bits. Thus, setting the predetermined number of bits at a value implementing high efficiency makes it possible to utilize the bit stream register 62 and bit stream capturing section 68 efficiently.

Embodiment 11

In the present embodiment 11, the bit stream register 62 has a width of N bits per word, where N is a given natural number, and when the number of the significant bits of the bit stream inserted by the bit stream capturing section 68 into the bit stream register 62 is less than N, the bit stream capturing section 68 adds the non-significant bits to the end of the bit stream inserted to make it N-bit wide code word.

Next, the operation of the present embodiment 11 will be described.

Although the bit stream with the predetermined number of bits is newly inserted in the foregoing embodiment 10, when the significant bits stored in the bit stream register 62 to be decoded is less than N bits, the width of the bit stream register 62 (16 bits in the present embodiment), the bit stream capturing section 68 can add the non-significant bits to it. Thus, this aspect does not limit the present invention.

In this case, the processor 61 can make the decision as to the non-significant bits when reading data from the bit stream register 62, which serves to eliminate a problem that can take place when generating the address of the table memory 63.

As described above, according to the present embodiment 11, when the number of the significant bits of the bit stream register 62 is less than N, the bit stream capturing section 68 adds the non-significant bits to the end of the bit stream inserted to make it N-bit wide. Thus, the present embodiment 11 can facilitate the data handling.

Embodiment 12

The present embodiment 12 is characterized in that the processor 61 also carries out the decoding processing of the fixed length code.

Next, the operation of the present embodiment 12 will be described.

Although the foregoing embodiments decode the variable length code, the international standard coding methods such as the H.261 and MPEG2 sometimes do not assign the variable length codes to the less-frequently occurring events, but encode them using the fixed length coding. In this case, the processor 61 makes a decision as to whether they are a fixed length code (as in the case where the table memory 63 includes no word data with the zero-run number corresponding to the code), and for the fixed length code, the processor 61 carries out the decoding of the fixed length code. This is because causing the processor 61, which can perform more flexible processing by software, to carry out the decoding processing is more efficient in terms of the processing time than to install a processing section that operates rarely for decoding the less-frequently occurring fixed length code.

As described above, according to the present embodiment 12, the processor 61 carries out the fixed length decoding corresponding to the less-frequently occurring events. Thus, it can perform the decoding processing of the less-frequently occurring events more efficiently.

Embodiment 13

In the present embodiment 13, the processor 61 carries out part of the series of the variable length decoding processings.

Next, the operation of the present embodiment 13 will be described.

Although the foregoing embodiments perform the series of the variable length decoding processings using the various sections as described above, the processor 61 can carry out the address generation, shift processing and part of other processings. It is obvious, however, that it is inefficient for the processor 61 to perform the entire variable length decoding processing in sequence because the processor 61 carries out the control of the various sections as shown in FIG. 8 considering their parallel processings.

As described above, the present embodiment 13 is configured such that the processor 61 carries out part of the series of the variable length decoding processings. Thus, the processor 61 and the various sections can perform the parallel and distributed processings, improving the efficiency of the total processing.

What is claimed is:

1. A variable length coding unit comprising:

a run-length converter for converting block data consisting of a plurality of image signals into combined data in accordance with a scanning sequence, each of the combined data including a number of consecutive insignificant coefficients and a value of a significant coefficient next to the consecutive insignificant coefficients;

a table memory for storing a variable length code and its code length corresponding to the combined data at an address corresponding to the combined data;

variable length encoder for reading the variable length code and its code length from said table memory in accordance with the combined data converted by said run-length converter, and for carrying out variable length coding of the variable length code by cutting it from the read data in accordance with the code length; and a buffer memory for recording variable length coded data passing through the variable length coding by said variable length encoder;

a shifter for shifting the variable length coded data by a predetermined number of bits, when the variable length coded data stored in said buffer memory exceeds the predetermined number of bits;

a data output section for outputting the variable length coded data undergoing the bit shift by the predetermined number of bits by said shifter; and a processor for activating and controlling at least part of said run-length converter, said variable length encoder, said buffer memory, said shifter and said data output section.

2. The variable length coding unit according to claim 1, wherein said table memory has a word width of L bits, and stores the variable length code with a maximum length of m bits from a most significant bit side of the L-bit width, and its code length with a length of n bits from the least significant bit side of the L-bit width, where L is a given natural number, and m and n are natural numbers satisfying $L=m+n$.

3. The variable length coding unit according to claim 2, wherein said variable length encoder comprises a variable length coded data cutting section for reading the n-bit code length of the variable length code from the least significant bit side of the L-bit width of said table memory, and for cutting the variable length code from the most significant bit side by a length indicated by the code length.

4. The variable length coding unit according to claim 1, wherein said table memory adds non-significant bits to an end of a variable length code with a length of less than m bits to make it m-bit data.

5. The variable length coding unit according to claim 1, wherein said processor carries out, for a less-frequently occurring event, coding of a fixed length code corresponding to the event.

6. The variable length coding unit according to claim 1, wherein said processor carries out part of a series of variable length coding processings.

7. A variable length decoding unit comprising:

a bit stream register for storing a received bit stream;

a table memory for storing a code length of each variable length code in connection with combined data including a number of consecutive insignificant coefficients and a value of a significant coefficient next to the consecutive insignificant coefficients in accordance with a scanning sequence of block data consisting of a plurality of image signals;

a data reader for reading a predetermined number of bits from said bit stream register;

an address generator for generating an address of said table memory from data read from said data reader;

a variable length decoder for reading data from the address of said table memory generated by said address generator, and for carrying out variable length decoding by cutting from the data the number of the consecutive insignificant coefficients, the value of the significant coefficient and the code length of the variable length code; and a shifter for shifting data in said bit stream register by the code length of the variable length code that is cut by said variable length decoder, to discard data by the length of the variable length code passing through the variable length decoding;

a bit stream capturing section for inserting the received bit stream into said bit stream register without leaving any spacing between bits when said bit stream register has a space greater than a predetermined number of bits;

an image signal generator for generating the block data consisting of the plurality of image signals in response to the number of the consecutive insignificant coefficients and the value of the significant coefficient passing through the variable length decoding by said variable length decoder in accordance with the scanning sequence; and a processor for activating and controlling at least part of said bit stream register, said data reader, said address generator, said variable length decoder, said shifter, said bit stream capturing section and said image signal generator.

8. The variable length decoding unit according to claim 7, wherein said table memory stores data that changes its bit fields associated with the number of the consecutive insignificant coefficients, with the value of the significant coefficient and with the code length of the variable length code in accordance with a coding scheme used for connecting to a party station.

9. The variable length decoding unit according to claim 7, wherein said shifter shifts data in said bit stream register toward a most significant bit side, and said bit stream capturing section inserts a bit stream into said bit stream register beginning from the most significant bit side without leaving any spacing between bits.

10. The variable length decoding unit according to claim 7, wherein said bit stream capturing section inserts the bit stream by a predetermined number of bits.

11. The variable length decoding unit according to claim 7, wherein said bit stream register has a word width of N bits, and when inserting a bit stream whose number of significant bits is less than N into said bit stream register, said bit stream capturing section adds non-significant bits to an end of the bit stream to make the bit stream N bits wide, where N is a given natural number.

12. The variable length decoding unit according to claim 7, wherein said processor carries out decoding processing of a fixed length code.

13. The variable length decoding unit according to claim 7, wherein said processor carries out part of a series of variable length decoding processings.

* * * * *